(12) United States Patent
Nagamine et al.

(10) Patent No.: US 9,142,756 B2
(45) Date of Patent: Sep. 22, 2015

(54) TUNNELING MAGNETORESISTIVE ELEMENT HAVING A HIGH MR RATIO

(71) Applicants: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

(72) Inventors: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

( * ) Notice: Subject to any disclaimer, the term of this patent is extended or adjusted under 35 U.S.C. 154(b) by 0 days.

(21) Appl. No.: 14/157,387

(22) Filed: Jan. 16, 2014

(65) Prior Publication Data

US 2015/0069543 A1 Mar. 12, 2015

Related U.S. Application Data

(60) Provisional application No. 61/874,628, filed on Sep. 6, 2013.

(51) Int. Cl.
| | | |
|---|---|---|
| *G11B 5/39* | (2006.01) | |
| *H01L 43/02* | (2006.01) | |
| *H01L 43/12* | (2006.01) | |
| *H01L 43/10* | (2006.01) | |

(52) U.S. Cl.
CPC ............. *H01L 43/02* (2013.01); *G11B 5/3909* (2013.01); *H01L 43/10* (2013.01); *H01L 43/12* (2013.01)

(58) Field of Classification Search
CPC ............ G11B 5/33; G11B 5/332; G11B 5/39; G11B 5/3903; G11B 5/3906; G11B 5/3909
USPC .................. 360/324.1, 324.11, 324.12, 324.2
See application file for complete search history.

(56) References Cited

U.S. PATENT DOCUMENTS

| | | | | |
|---|---|---|---|---|
| 5,828,525 | A * | 10/1998 | Iwasaki et al. | 360/314 |
| 8,456,882 | B2 * | 6/2013 | Apalkov et al. | 365/66 |
| 8,659,103 | B2 * | 2/2014 | Watanabe et al. | 257/421 |
| 2008/0112093 | A1 * | 5/2008 | Sato et al. | 360/324.2 |
| 2008/0286612 | A1 * | 11/2008 | Ishizone et al. | 428/800 |
| 2010/0316890 | A1 | 12/2010 | Choi et al. | |
| 2013/0015539 | A1 * | 1/2013 | Choi | 257/421 |
| 2013/0028013 | A1 | 1/2013 | Ikeda et al. | |
| 2013/0059168 | A1 * | 3/2013 | Tahmasebi et al. | 428/811.2 |
| 2015/0076633 | A1 * | 3/2015 | Siddik et al. | 257/421 |

FOREIGN PATENT DOCUMENTS

| | | |
|---|---|---|
| JP | 2010-205931 A | 9/2010 |
| WO | WO 2010/137679 A1 | 12/2010 |

OTHER PUBLICATIONS

Koji Tsunekawa, et al.: "Giant tunneling magnetoresistance effect in low-resistance (CoFeB/MgO(001)/CoFeB magnetic tunnel junctions for read-head applications", Applied Physics Letters 87, Aug. 8, 2005, pp. 072503-1-072503-3 (in English).

* cited by examiner

*Primary Examiner* — Jefferson Evans
(74) *Attorney, Agent, or Firm* — Holtz, Holtz, Goodman & Chick PC

(57) ABSTRACT

A magnetoresistive element includes a first ferromagnetic layer formed on a base substrate, a tunnel barrier layer formed on the first ferromagnetic layer, and a second ferromagnetic layer containing B formed on the tunnel barrier layer. The second ferromagnetic layer includes at least one of H, F, Cl, Br, I, C, O, and N, and a concentration of molecules of the at least one of H, F, Cl, Br, I, C, O, and N included in the second ferromagnetic layer is higher in a central portion in a depth direction of the second ferromagnetic layer than in an upper surface and a lower surface thereof.

4 Claims, 9 Drawing Sheets

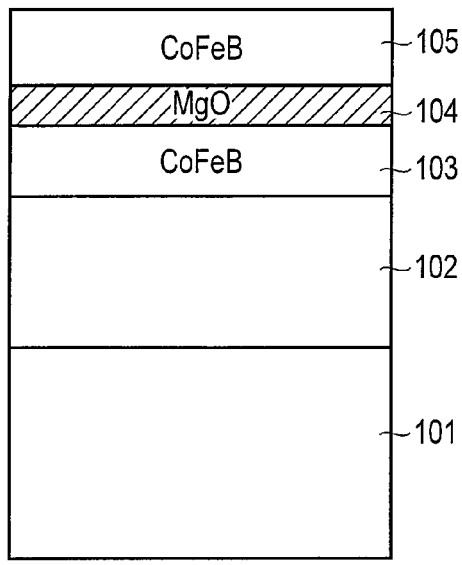
F I G. 1 A
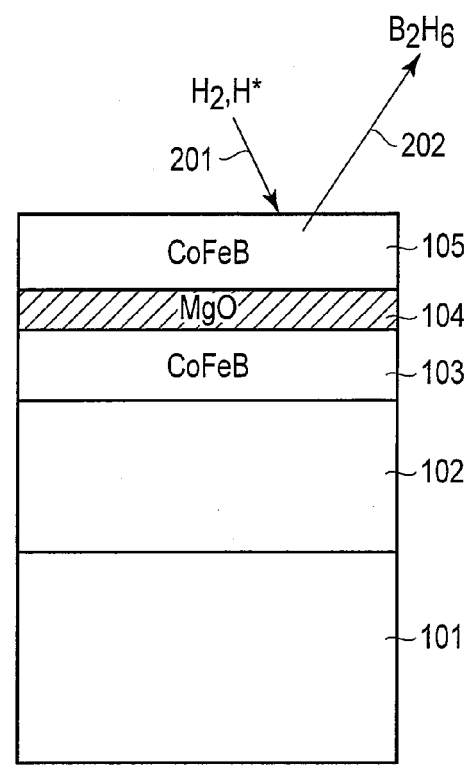
F I G. 1 B
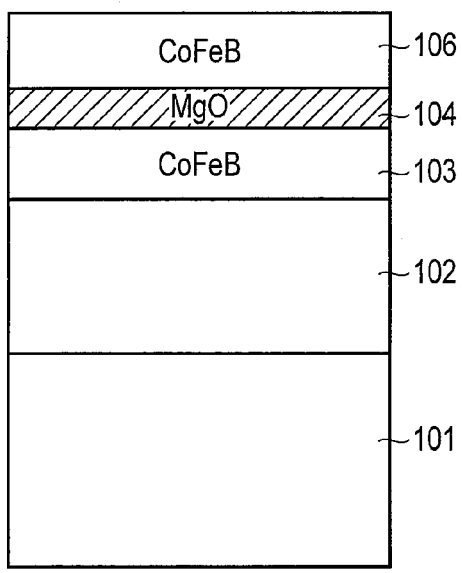
F I G. 1 C

| No | Material | mp(C) | bp(C) |
|---|---|---|---|
| 1 | $B_2H_6$ | -164.85 | -92.49 |
| 2 | $BBr_3$ | -46 | 91.3 |
| 3 | $B_2Cl_4$ | -92.6 | 66.5 |
| 4 | $BCl_3$ | -107.3 | 12.5 |
| 5 | $B_2F_4$ | 56 | -34 |
| 6 | $BF_3$ | -126.8 | -99.9 |
| 7 | $B(CH_3)_3$ | -161.5 | -21 |
| 8 | $B(C_2H_5)_3$ | -93 | 95.2 |
| 9 | $BBr(CH_3)_2$ | -129 | 31 |
| 10 | $B(C_2H_5)_2Cl$ | -84.6 | 78.5 |
| 11 | $B(C_6H_5)Cl_2$ | 7 | 175 |
| 12 | $(C_2H_5)_2O\text{-}BF_3$ | -70 | 126 |
| 13 | $C_6H_5N\text{-}BH_3$ | 10 | 65 |
| 14 | $B(OCH_3)_3$ | -29 | 69 |
| 15 | $(BHNH)_3$ | -58 | 53 |
| 16 | $[(CH_3)_2B]_2O$ | -21.2 | 34.8 |
| 17 | $C_6H_5BO_2$ | 12 | 50 |
| 18 | $B(OC_2H_5)_3$ | -85 | 117 |
| 19 | $B(OC_4H_9)_3$ | -70 | 230 |
| 20 | $CH_3BO$ | -137 | -64 |
| 21 | $CH_3BCl_2$ | unknown | 11 |
| 22 | $CH_3BF_2$ | unknown | -78.5 |
| 23 | $BH(OCH_3)_2$ | -130.6 | 25.9 |
| 24 | $B(CH_3)_2(SCH_3)$ | -84 | 71 |
| 25 | $BI_3$ | 49.7 | 209.5 |
|  |  |  |  |
| ref1 | BN | 2967 | unknown |
| ref2 | $B_2O_3$ | 450 | unknown |
| ref3 | B | 2075 | 4000 |

FIG. 2

| No | Material | mp(C) | bp(C) |
|---|---|---|---|
| 1 | $H_2$ | -259.198 | -252.762 |
| 2 | $F_2$ | -219.67 | -188.12 |
| 3 | HF | -83.36 | 20 |
| 4 | $Cl_2$ | -101.5 | -34.04 |
| 5 | HCl | -114.17 | -85 |
| 6 | $Br_2$ | -7.2 | 58.8 |
| 7 | HBr | -86.8 | -66.38 |
| 8 | $I_2$ | 113.7 | 184.4 |
| 9 | HI | -50.76 | -35.55 |
| 10 | $BrF_3$ | 8.77 | 125.8 |
| 11 | $BrF_5$ | -60.5 | 41.3 |
| 12 | ClF | -155.6 | -101.1 |
| 13 | $ClF_3$ | -76.34 | 11.75 |
| 14 | $ClF_5$ | -103 | -13.1 |
| 15 | $CBr_4$ | 92.3 | 189.5 |
| 16 | $CCl_4$ | -22.62 | 76.8 |
| 17 | $CF_4$ | -183.6 | -128 |
| 18 | $CF_3I$ | unknown | -22.5 |
| 19 | $CHCl_3$ | -63.41 | 61.17 |
| 20 | $CBr_3F$ | -73.6 | 108 |

FIG. 3A

| No | Material | mp(C) | bp(C) |
|---|---|---|---|
| 1 | $CH_2=CH_2$ | -169.15 | -103.77 |
| 2 | $CH\equiv CH$ | -80.7tp | -84.7 |
| 3 | $CH_2=C=CH_2$ | -136.6 | -34.4 |
| 4 | $CH_2=CHCH_3$ | -185.24 | -47.69 |
| 5 | $C_6H_6$ | 5.49 | 80.09 |
| 6 | $CH_2=CHC_2H_5$ | -185.34 | -6.26 |
| 7 | cis-$CH_3CH=CHCH_3$ | -138.88 | 3.71 |
| 8 | trans-$CH_3CH=CHCH_3$ | -105.52 | 0.88 |
| 9 | $CH_2=CHC_3H_7$ | -165.12 | 29.96 |
| 10 | $CH_2=CHC_4H_9$ | -139.76 | 63.48 | tp:triple point

FIG. 3B

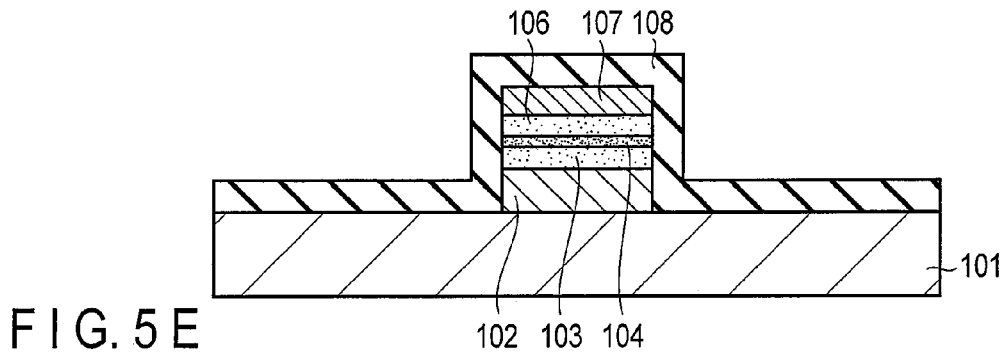
F I G. 5 E
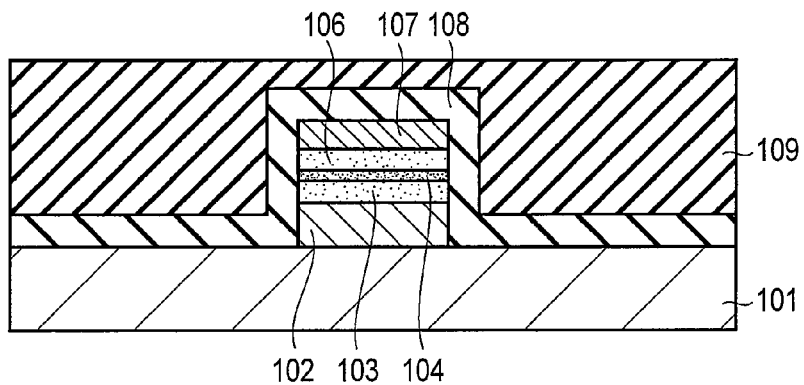
F I G. 5 F
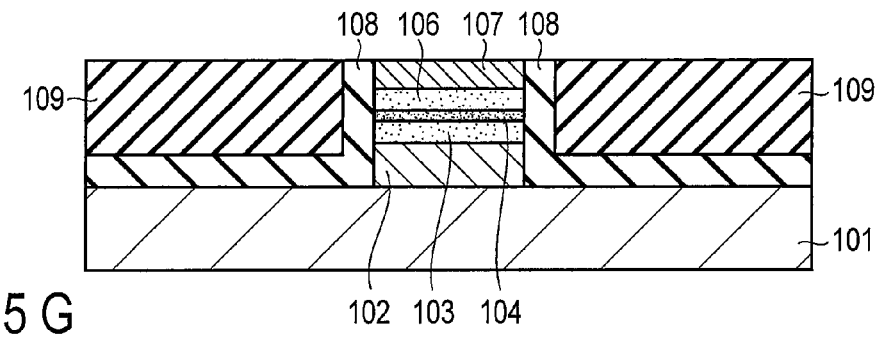
F I G. 5 G
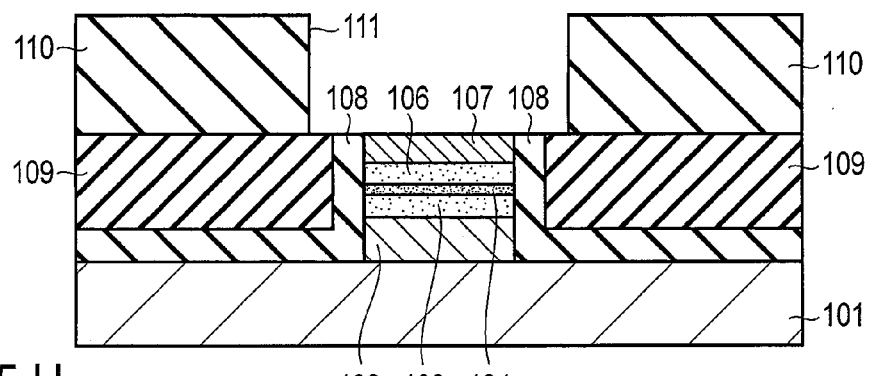
F I G. 5 H

| No | Material | mp(C) | bp(C) |
|---|---|---|---|
| 1 | $CH_3OCH_3$ | -141.5 | -24.8 |
| 2 | $C_2H_5OCH_3$ | -113 | 7.4 |
| 3 | $C_2H_5OC_2H_5$ | -116.2 | 34.5 |
| 4 | $C_3H_7OC_3H_7$ | -114.8 | 90.08 |
| 5 | $C_4H_9OC_4H_9$ | -95.2 | 140.28 |

FIG. 8

TUNNELING MAGNETORESISTIVE ELEMENT HAVING A HIGH MR RATIO

CROSS-REFERENCE TO RELATED APPLICATIONS

This application claims the benefit of U.S. Provisional Application No. 61/874,628, filed Sep. 6, 2013, the entire contents of which are incorporated herein by reference.

FIELD

Embodiments described herein relate generally to a magnetoresistive element used for a magnetoresistive random access memory, and a method of manufacturing the same.

BACKGROUND

Nowadays, large-capacity magnetoresistive random access memories (MRAMs) using a magnetic tunnel junction (MTJ) element exploiting the tunnel magnetoresistive (TMR) effect have gained attention and raised expectations. In an MTJ element used for an MRAM, one of two ferromagnetic layers (CoFeB) holding a tunnel barrier layer (MgO) therebetween is used as a magnetization fixed layer (reference layer) in which the direction of magnetization is fixed and prevented from changing, and the other is used as a magnetization free layer (storage layer) in which the direction of magnetization is easily reversed. The state where the directions of magnetization of the reference layer and the storage layer are parallel and the state where the directions of magnetization are antiparallel are correlated with binary numbers "0" and "1", respectively, and thereby information can be stored.

When the directions of magnetization of the reference layer and the storage layer are parallel with each other, the resistance (barrier resistance) of the tunnel barrier layer is lower than that in the case where the directions of magnetization are antiparallel, and has greater tunnel current. The equation "MR ratio=(resistance in the antiparallel state−resistance in the parallel state)/resistance in the parallel state" holds. Stored information is read out by detecting a change in resistance caused by the TMR effect. Thus, it is preferable that a resistance change rate (MR ratio) caused by the TMR effect is large in reading.

BRIEF DESCRIPTION OF THE DRAWINGS

FIGS. 1A to 1C are schematic diagrams for explaining function of a first embodiment.

FIG. 2 is a diagram illustrating melting points and boiling points of boron-containing compounds.

FIGS. 3A and 3B are diagrams illustrating examples of candidates for a treatment gas that is reactive with boron.

FIGS. 5A to 5H are cross-sectional views illustrating a process of manufacturing the magnetoresistive element of FIG. 4.

FIG. 8 is a diagram illustrating examples of candidates for the material used for liquid phase treatment.

DETAILED DESCRIPTION

Figure 4:
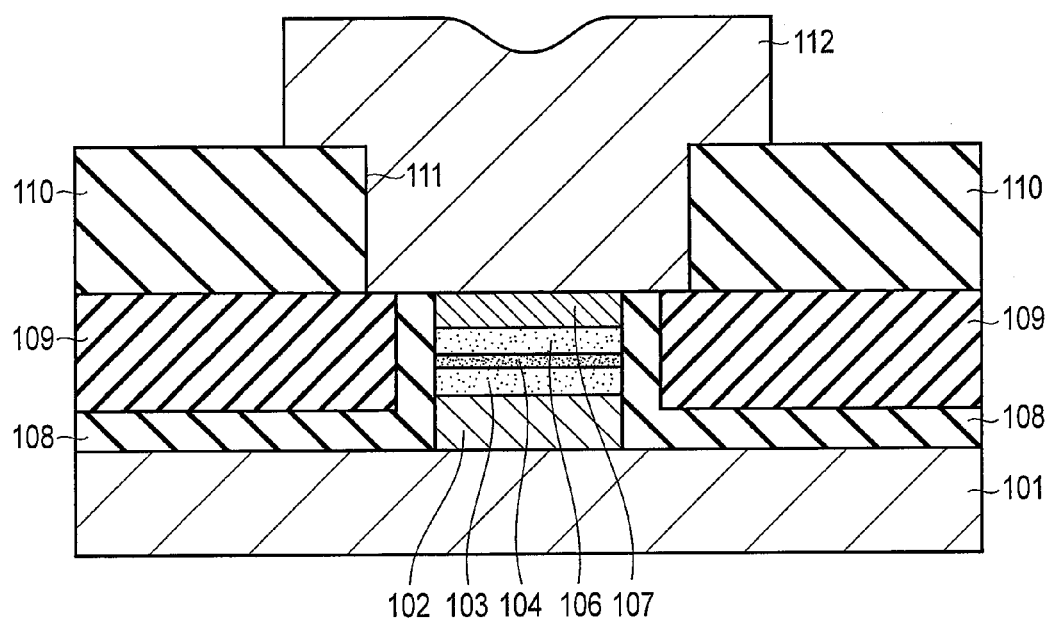
FIG. 4 is a cross-sectional view illustrating a schematic structure of a magnetoresistive element according to the first embodiment.

In general, according to one embodiment, a method of manufacturing a magnetoresistive element comprises: forming a first ferromagnetic layer on a base substrate; forming a tunnel barrier layer on the first ferromagnetic layer; forming a second ferromagnetic layer containing B on the tunnel barrier layer; and performing annealing in a gas-phase atmosphere including a gas, after formation of the second ferromagnetic layer, the gas producing a reaction product with B, the reaction product having a melting point lower than a treatment temperature.

In a conventional method of manufacturing an MTJ element, an MTJ film that expresses a TMR effect is formed on a surface of a substrate, and thereafter annealing is performed. Directly after the film formation, CoFeB is amorphous, and MgO has crystallinity. After the film formation, annealing is performed, thereby CoFeB is crystallized, (001) orientation of CoFeB—MgO—CoFeB is formed with MgO used as a template, and high MR ratio is expressed.

However, although it is required in the above method that boron (B) being an obstacle to formation of (001) orientation is diffused and discharged from the CoFeB layer into the adjacent layer, there is a limit to reduction in B concentration in CoFeB achieved by diffusion into the outside, which is an obstacle to expression of high MR ratio that (001) orientation has. For example, the magnetic properties deteriorate, when the thermal treatment temperature is increased to promote reduction in B concentration caused by diffusion.

First Embodiment

A basic principle of the first embodiment will now be explained, before the specific embodiment is explained.

FIGS. 1A to 1C are schematic diagrams for explaining action of a magnetoresistive element according to the first embodiment.

To manufacture a magnetoresistive element, a lower interconnect layer 101 of Ta or the like, an underlayer 102 of Ru or the like, a CoFeB layer (first ferromagnetic layer) 103, an MgO layer (tunnel barrier layer) 104, and a CoFeB layer (second ferromagnetic layer) 105 are laminated in this order on a base substrate (not shown), as illustrated in FIG. 1A. Thereby, an MTJ film is formed. In this structure, the CoFeB layer 105 is in an amorphous state.

Next, as illustrated in FIG. 1B, a treatment gas 201 such as $H_2$ and H radical that react with boron (B) is supplied to a surface of the CoFeB layer 105, and thereby B is eliminated from the CoFeB layer 105 as a volatile product 202 containing B.

As a result, as illustrated in FIG. 1C, the CoFeB layer 106 on the MgO layer 104 has B concentration lower than that of the CoFeB layer 105. Thus, the B concentration in the CoFeB layer 106 after annealing is more reduced than in the case of using a conventional manufacturing method in which the above gas treatment is not performed, and thereby (001) orientation of CoFeB—MgO—CoFeB is promoted.

FIG. 2 is a diagram illustrating melting points and boiling points of boron-containing compounds. The B-containing product is required to have a melting point lower than the treatment temperature, and be in a liquid state at the treatment temperature, since B should be eliminated from the surface of the substrate in at least the treatment temperature for treatment with the treatment gas 201. Since a compound in a liquid state has vapor pressure, it is considered that B is eliminated from the surface of the substrate in a vacuum with reduced pressure. More specifically, since the substrate is generally conveyed in the vacuum apparatus at room temperature, the boiling point of the B-containing product is preferably less than or equal to room temperature, to suppress the possibility that the B-containing protects remains on the surface of the substrate.

In Examples 1 to 25 of FIG. 2, the melting points of most B-containing compounds are less than or equal to room temperature, and all the melting points are less than or equal to the treatment temperature in the case of using the treatment temperature of about 250° C. In addition, the boiling points of most B-containing compounds are less than or equal to room temperature, and all the boiling points are less than or equal to the treatment temperature in the case of using the treatment temperature of about 250° C.

Referring to FIG. 2, it is preferable to use a B compound with H, F, Cl, Br, I, CxOy, or CxOyNz as the B-containing compound.

FIG. 3A and FIG. 3B are examples of candidates for the treatment gas 201 that reacts with B. Referring to FIG. 2, reactive gas containing H, F, Cl, Br, or I that react with B may be used, as illustrated in FIG. 3A. In addition, as illustrated in FIG. 3B, CxOyZz having a double bond of C (for example, C=C) that react with B, or a triple bond of C (for example, C≡C) may be used.

In the case of using a gas including a double bond or a triple bond, hydroboration, which is famous in organic chemistry, occurs as reaction of the double bond or the triple bond against B.

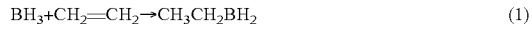

$$BH_3 + CH_2=CH_2 \rightarrow CH_3CH_2BH_2 \quad (1)$$

In reaction against B in CoFeB, a double bond or a triple bond of carbon is coordinated to B to generate an organic boron compound, and thereby elimination of B is expected. Specifically, gas including a double bond or a triple bond is suitable for eliminating B from CoFeB.

A gas used for eliminating B from CoFeB is not limited to the above various treatment gases, but radicals thereof may be used.

The treatment gas to be reacted with B is required to have a melting point lower than the treatment temperature, and to be in a liquid state at the treatment temperature, so as not to be deposited on the surface of the substrate at least at the treatment temperature. Since a compound in a liquid state has vapor pressure, it is considered that B is eliminated from the surface of the substrate in a vacuum with reduced pressure. More specifically, since the substrate is generally conveyed in the vacuum apparatus at room temperature, the boiling point of the treatment gas is preferably less than or equal to room temperature, to suppress the possibility that the treatment gas remains on the surface of the substrate.

In Examples 1 to 20 of FIG. 3A and Examples 1 to 10 of FIG. 3B, the melting points of most treatment gases are less than or equal to room temperature, and all the melting points are less than or equal to the treatment temperature in the case of using the treatment temperature of about 200° C. In addition, the boiling points of most treatment gases are less than or equal to room temperature, and all the boiling points are less than or equal to the treatment temperature in the case of using the treatment temperature of about 200° C. Thus, any of the gases may be used.

The reference symbol "tp" in FIG. 3B represents the triple point, and indicates a temperature at which the solid phase, the liquid phase, and the gas phase coexists. The triple point of acetylene occurs at a temperature of −80.7° C., and a pressure of 0.1276 MPa (1.26 atm). Acetylene cannot exist as solid at a pressure of at least 1.26 atm. Thus, the melting point of acetylene is shown as −80.7° C. with the note "tp". The boiling point of acetylene is a value at 1 atm, the melting point of acetylene is a value at 1.26 atm, and the atmospheric pressure of the melting point is higher than that of the boiling point. Thus, the melting point of acetylene is higher than the boiling point thereof in appearance.

In consideration of the above, the following can be used as the gas and the atmosphere used for treating the surface of the CoFeB serving as the ferromagnetic layer of an MTJ.

(1) A gas-phase atmosphere containing $H_2$ gas molecules
(2) A gas-phase atmosphere containing gas molecules of any of F, Cl, Br, and I atoms
(3) A gas-phase atmosphere containing gas molecules including a double bond of any of C=C, C=O, and C=N
(4) A gas-phase atmosphere containing gas molecules including a triple bond of any of C≡C, and C≡N Treatment using the above gas enables reduction in the B concentration in CoFeB, efficient (001) orientation by annealing performed thereafter, and high MR ratio.

The following is explanation of a specific structure of a magnetoresistive element and a method of manufacturing thereof according to the present embodiment.

FIG. 4 is a cross-sectional view illustrating a schematic structure of a magnetoresistive element according to the present embodiment. The element is an MTJ element used for an MRAM.

An underlayer 102 of Ru or the like, a first ferromagnetic layer 103 formed of CoFeB, a tunnel barrier layer 104 formed of MgO, a second ferromagnetic layer 106 formed of CoFeB, and an upper interconnect layer 107 are laminated on a lower interconnect layer 101 formed of Ta and formed on a substrate (not shown), and the laminate structure part is processed to have an island shape.

In the structure, the second ferromagnetic layer 106 has a reduced B concentration obtained by treatment in a gas-phase atmosphere with the gas described above. In addition, the B concentration in the second ferromagnetic layer 106 is 1% or more in a central portion in a depth direction of the second ferromagnetic layer 106, and less than 1% in an upper surface portion of the second ferromagnetic layer 106. The symbol "%" in the present specification is "atomic %" in a strict sense, but is used to simplify the explanation.

An insulation layer 108 formed of SiN or the like to protect the MTJ part is formed on side surfaces of the MTJ part with an island shape and the lower interconnect layer 101. In addition, an insulation layer 109 such as $SiO_2$ is embedded to be formed on the side surfaces of the MTJ part, with the insulation layer 108 held therebetween.

An insulation layer 110 such as $SiO_2$ is formed on the insulation layer 109 and the MTJ part, and a contact hole 111 opened on the MTJ part is formed in the insulation layer 110. An upper interconnect layer 112 of Al or the like is formed on the insulation layer 110 to fill the contact hole 111, and the upper interconnect layer 112 is processed into an interconnect pattern.

Although not shown, magnetoresistive elements of the present embodiment are arranged in respective crossing points of bit lines BL and word lines WL that are arranged to cross one another, and each of the elements functions as a memory cell of an MRAM.

Next, a method of manufacturing a magnetoresistive element of the present embodiment will be explained hereinafter with reference to FIGS. 5A to 5H.

Figure 5A:
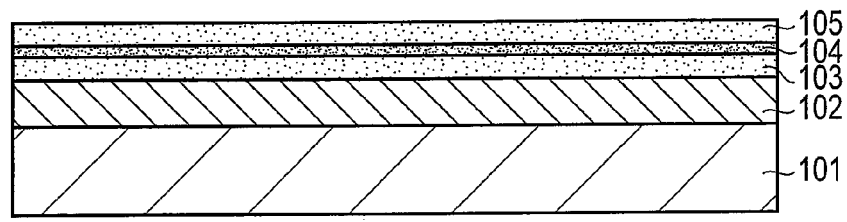

First, as illustrated in FIG. 5A, an underlayer 12 formed of Ru and having a thickness of 2 nm, a CoFeB layer (first ferromagnetic layer) 13 having a thickness of 1.5 nm, an MgO layer (tunnel barrier layer) 104 having a thickness of 1 nm, and a CoFeB layer (second ferromagnetic layer) 105 having a thickness of 1.5 nm are formed on a lower interconnect layer 11 formed of Ta and having a thickness of 5 nm. The underlayer 12 may also serve as a reference layer. The first ferromagnetic layer 103 may be used as a reference layer or a storage layer.

The method of forming the tunnel barrier layer 104 may be any of direct sputtering by RF of an oxide target, after oxidation with an oxide gas of the metal layer, oxygen plasma, an oxygen radical, or ozone, molecular beam epitaxy (MBE), atomic layer deposition (ALD), and chemical vapor deposition (CVD), or another method. The method of forming the first and second ferromagnetic layers 103 and 105 may be any of sputtering, MBE, and ALD.

Figure 5B:
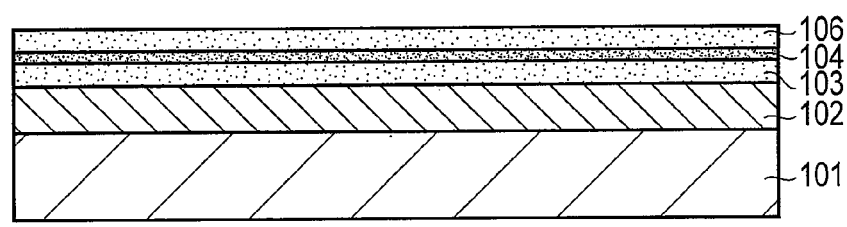

Next, gas treatment according to the present embodiment is applied, to form a CoFeB layer (second ferromagnetic layer) 106 with a reduced B concentration lower than that of the CoFeB layer 105, as illustrated FIG. 5B. The CoFeB layer 106 may be used as a storage layer or a reference layer.

Specifically, $H_2$ gas is introduced into a vessel containing a substrate with the structure illustrated in FIG. 5A, the substrate is treated for about five minutes at room temperature, and B is eliminated from the surface of the CoFeB layer 105. As described above, B can be efficiently eliminated, by treatment performed in a gas-phase atmosphere of a gas that reacts with B and in a state where the whole surface of the CoFeB layer 105 is exposed. This structure enables efficient (001) orientation obtained by annealing performed thereafter, and achieves high MR ratio.

The treatment temperature is not limited to room temperature, but the substrate may be heated to 200 to 300° C. within a range of not causing deterioration in the magnetic properties in the MTJ part. The treatment time may be changed if necessary.

Figure 5C:
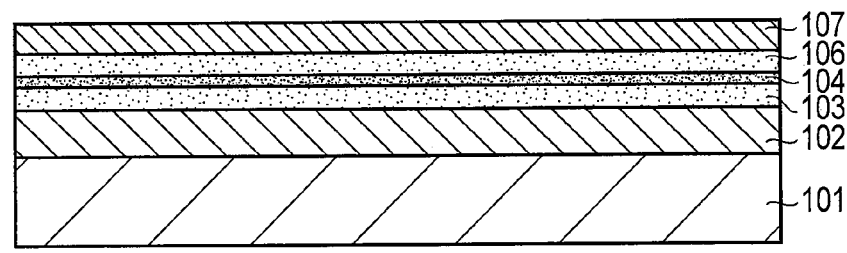

Next, as illustrated in FIG. 5C, an upper layer 107 formed of Ta or the like is formed on the CoFeB layer 106. The upper layer 107 may be used as an etching mask, a reference layer, a surface protective layer, or an upper interconnect connection layer. The annealing performed for crystallizing CoFeB is not necessarily performed directly after formation of the CoFeB layer 106, but may be performed after formation of the upper layer 107.

Figure 5D:
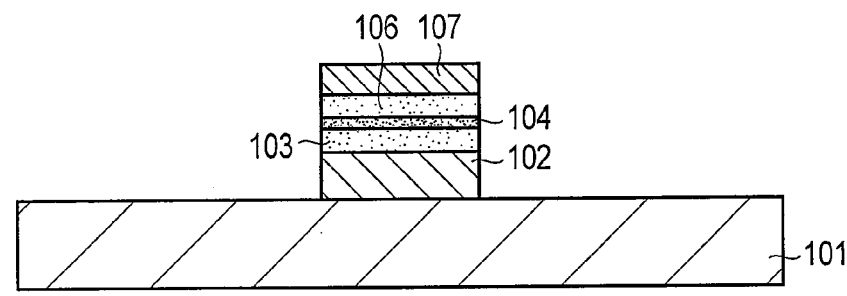

Then, as illustrated in FIG. 5D, the upper layer 107, the second ferromagnetic layer 106, the tunnel barrier layer 104, the first ferromagnetic layer 103, and the underlayer 102 are successively and selectively etched by ion milling or the like, to process the laminate structure part formed of the underlayer 102 to upper layer 107 to have an island shape.

Next, as illustrated in FIG. 5E, an insulation layer 108 to protect the MTJ part in the following step is formed by sputtering, CVD, or ALD or the like. The insulation layer 108 is, for example, SiN, SiOx, MGO, and AlOx, and formed on the upper surface and side surfaces of the MTJ part and an exposed upper surface of the lower interconnect layer 101.

Next, the lower interconnect layer 101 is selectively etched by reactive ion etching (RIE) or the like. The processed portions of the lower interconnect layer 11 are located in the front part and the rear part of FIG. 5E, and not shown. In the etching, the MTJ part is protected by the insulation layer 108 illustrated in FIG. 5E.

Then, as illustrated in FIG. 5F, an insulation layer 109 is formed on the insulation layer 108 by sputtering or CVD or the like, to bury the MTJ part. The insulation layer 109 is, for example, SiOx.

Next, as illustrated in FIG. 5G, the insulation layer 109 is subjected to etchback by chemical mechanical polishing (CMP) or gas phase etching, to expose an upper surface of the upper layer 107 of the MTJ part.

Then, as illustrated in FIG. 5H, an insulation layer 110 is formed on the MTJ part and the insulation layer 109, and then a contact hole 111 is opened on the MTJ part, by RIE. The insulation layer 110 is, for example, SiOx.

Thereafter, an upper interconnect layer 112 formed of Al or Al—Cu is formed, and subjected to selective etching to have an interconnect pattern by RIE or the like. Thereby, a magnetoresistive element having the structure illustrated in FIG. 4 is finished.

Figure 6:
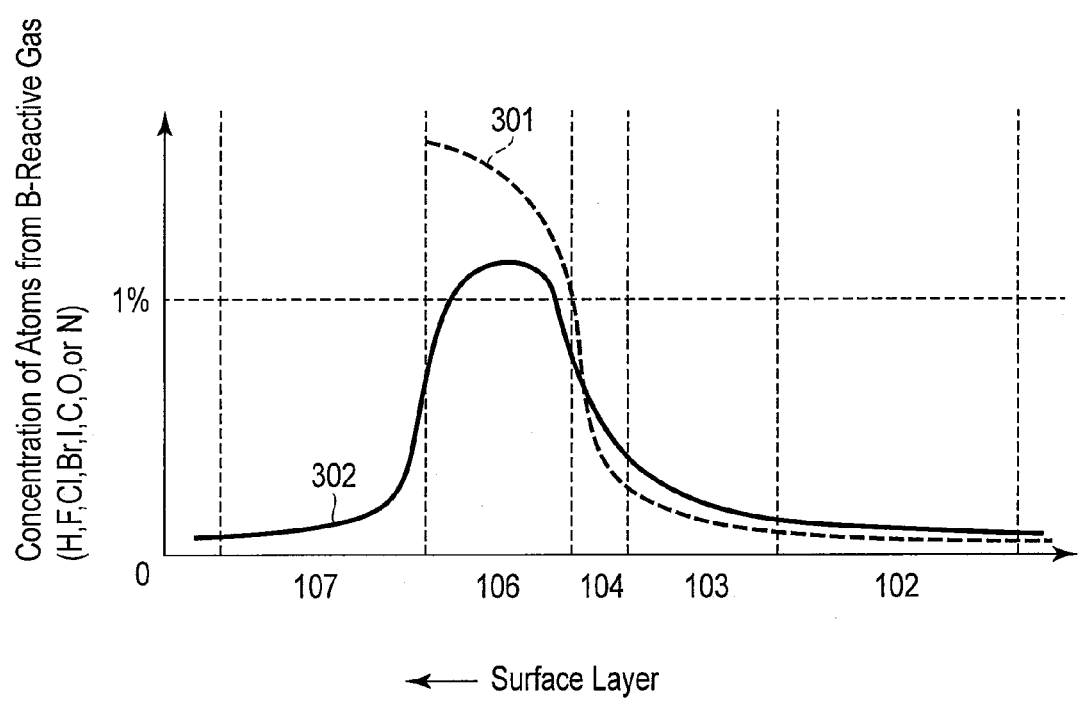
FIG. 6 is a diagram illustrating distribution of concentration of atoms forming the treatment gas.

FIG. 6 is a diagram illustrating a distribution of concentration of atoms forming the treatment gas, in the magnetoresistive element formed by the present embodiment. Directly after the gas treatment, the concentration is maximum at the uppermost surface of the second ferromagnetic layer 106, and gradually decreases as the distance from the surface increases, as indicated by broken line 301. On the other hand, after formation of the upper layer 107 and finish of the device manufacturing process, the atoms forming the treatment gas are diffused above the upper layer 107, and has a distribution in which the concentration is high in the central part and low in the lower surface and the upper surface, as indicated by solid line 302.

In the magnetoresistive element formed in the present embodiment, the atoms forming the treatment gas remain in the second ferromagnetic layer 106 by about 1% or more. These atoms remain between the atoms of the second ferromagnetic layer 106, and are considered as increasing the atomic distance between the atoms that express ferromagnetism. Since the volume as the magnetic layer increases with the magnetic properties maintained, there is the effect of improving the thermal stability $\Delta$ ($=E/kbT$) and suppressing abnormal magnetization reversal.

To improve the thermal stability, the concentration of the treatment gas forming atoms remaining in the second ferromagnetic layer 106 is preferably 1% or more. However, too much treatment gas forming atoms may cause deterioration in the magnetic properties. In consideration of them, the concentration of the treatment gas forming atoms in the second ferromagnetic layer 106 is 1% or more, and close to 1%, more preferably 1% or more in the central portion in the depth direction of the ferromagnetic layer 106 and less than 1% in the upper surface and the lower surface of the ferromagnetic layer 106.

As described above, according to the present embodiment, the CoFeB layer 105 serving as a ferromagnetic layer of the magnetoresistive element is formed, and then treated in a gas atmosphere that reacts with B, and thereby the CoFeB layer 106 with a reduced B concentration lower than that of the CoFeB layer 105 is formed. This structure promotes (001) orientation of CoFeB—MgO—CoFeB after annealing, and achieves high MR ratio. In particular, it is a large effect that good (001) orientation can be generated by annealing with a relatively thin CoFeB layer having a thickness of 1.5 nm. In addition, since the treatment gas forming atoms remain in the CoFeB 106, the volume as the magnetic layer increases with the magnetism of CoFeB maintained, and thus the structure has an advantage that the magnetic layer has improved thermal stability and abnormal magnetization reversal is suppressed.

Thus, it is possible to produce a magnetoresistive element with excellent property as a memory element of an MRAM, which is extremely effective.

Second Embodiment

Although the second ferromagnetic layer is treated in a gas-phase atmosphere in the first embodiment, the second ferromagnetic layer may be treated in a liquid-phase atmosphere instead.

Figure 7A:
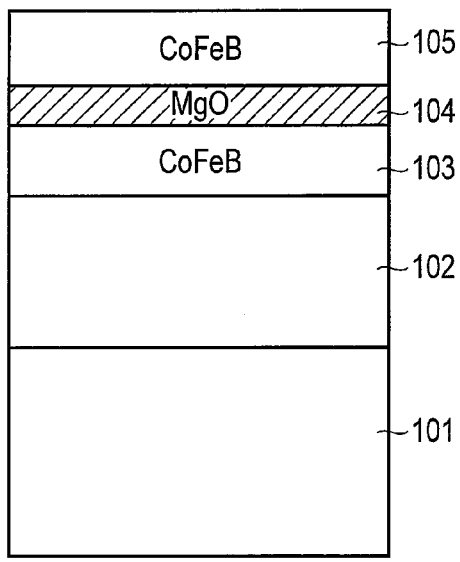
FIGS. 7A to 7C are schematic diagrams for explaining function of a second embodiment.
Figure 7B:
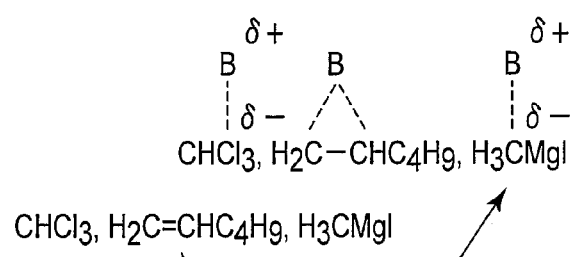
Figure 7B:
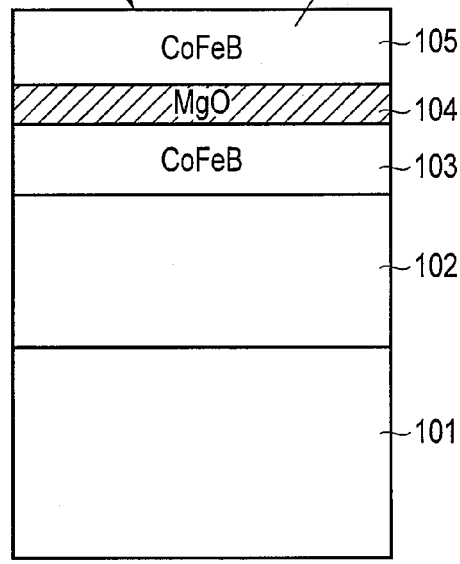
Figure 7C:
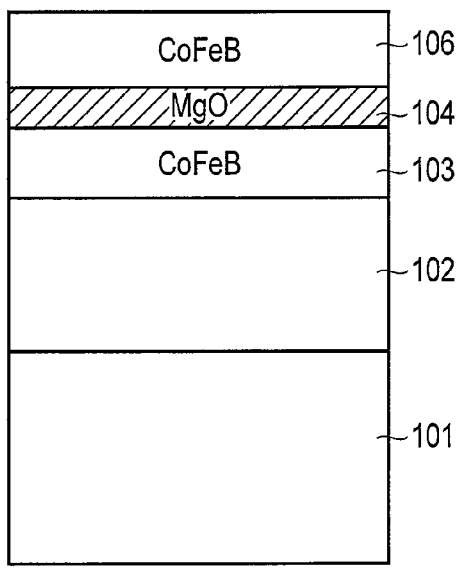

FIGS. 7A to 7C are schematic diagrams for explaining function of the present embodiment.

First, as illustrated in FIG. 7A, a lower interconnect layer 101, an underlayer 102, a CoFeB layer (first ferromagnetic layer) 103, an MgO layer (tunnel barrier layer) 104, and a CoFeB layer (second ferromagnetic layer) 105 are laminated in this order, like the structure illustrated in FIG. 1A.

Next, as illustrated in FIG. 7B, a substance (denoted by 401 in FIG. 7B) that reacts with B is supplied to a surface of the CoFeB layer 105 in a liquid phase atmosphere, and B is eliminated from the CoFeB layer 105 as a product containing B (denoted by 402 in FIG. 7B). The liquid-phase atmosphere may be any substance that includes a reactant that reacts with B as a main component, and is in a liquid phase at the treatment temperature. Even the reactant is not in a liquid phase at the treatment temperature, it suffices that the reactant is dissolved in a solvent of the liquid at the treatment temperature. Since it is the purpose of the treatment to eliminate B from CoFeB, it suffices that the product of the reaction with B is liquated in the liquid phase, even in a state of a reaction intermediate.

As a result, as illustrated in FIG. 7C, the CoFeB layer 106 on the MgO layer 104 has a B concentration lower than that of the CoFeB layer 105. Thus, the B concentration in the CoFeB layer 106 after annealing is reduced in comparison with that in a conventional manufacturing method, and (001) orientation of CoFeB—MgO—CoFeB is promoted.

Candidates for the substance used for the liquid-phase treatment illustrated in FIG. 7B are substances that are mentioned in FIG. 3A and contain F, Cl, Br, and I that react with B, and substances that are mentioned in FIG. 3B and includes a double bond of C=C, C=O, or C=N or a triple bond of C≡C or C≡N that reacts with B. Examples of substances that are in a liquid phase when the treatment temperature is room temperature are $CCl_4$, $CHCl_3$, $C_6H_6$, $CH_2=CHC_3H_7$, and $CH_2=CHC_4H_9$.

An example of reaction of a double bond or a triple bond against B is hydroboration indicated by the above expression (1). Like the above reaction, it is expected that a double bond or a triple bond is coordinated to B and B is eliminated in reaction against B in CoFeB.

FIG. 8 illustrates examples of solvents that are in a liquid phase at the treatment temperature being room temperature for a reactant that is not in a liquid phase at the treatment temperature. Ethers have high volatility, and may be easily removed from the surface of the substrate after liquid-phase treatment. Ethers are also useful as a solvent for the following Grinard reaction.

$$3CH_3MgI + BF_3 \rightarrow B(CH_3)_3 + 3MgIF \qquad (2)$$

A Grignard reagent represented by $Ch_3MgI$ in ether may be used in the present embodiment. $CH_3$ may be another alkyl group. I may be another halogen atom.

When the treatment temperature is not room temperature, a reactant or a solvent that is in a liquid phase at the temperature should be selected.

The following is explanation of a specific structure of a magnetoresistive element and a method of manufacturing thereof according to the present embodiment.

The basic structure thereof is similar to the structure of FIG. 4, and only different from the structure FIG. 4 in a method of forming the second ferromagnetic layer 106. The manufacturing method is substantially the same as the process illustrated in FIGS. 5A to 5H, and different only in treatment for the second ferromagnetic layer.

First, as illustrated in FIG. 5A, an underlayer 102 formed of Ru or the like, a CoFeB layer (first ferromagnetic layer) 103, an MgO layer (tunnel barrier layer) 104, and a CoFeB layer (second ferromagnetic layer) 105 are formed on a lower interconnect layer 101 of Ta or the like.

Next, liquid-phase treatment according to the present embodiment is applied, to form a CoFeB layer (second ferromagnetic layer) 106 with a reduced B concentration lower than that of the CeFeB layer 105. Specifically, a $CHCl_3$ solution is supplied to a surface of the substrate, on which the CoFeB layer 105 is formed, the substrate is treated for about five minutes at room temperature, and B in the CoFeB layer 105 is eliminated.

As the liquid-phase treatment, the solution may be sprayed on the surface of the CoFeB layer 105, or the surface of the CoFeB layer 105 may be immersed in the solution. The treatment temperature is not limited to room temperature, but the substrate may be heated to 200 to 300° C. within a range not deteriorating the magnetic properties. The treatment time may be changed.

The following steps are similar to the steps of FIGS. 5C to 5H. An upper layer 107 of Ta or the like is formed, and then the upper layer 107, the second ferromagnetic layer 106, the tunnel barrier layer 104, the first ferromagnetic layer 103, and the underlayer 102 are selectively etched. Then, an insulation layer 108 of SiN or the like and an insulation layer 109 of $SiO_2$ or the like are formed, and thereafter, the insulation layer 109 is etched back, to expose an upper surface of the upper layer 107 of the MTJ part. After an insulation layer 110 of $SiO_2$ or the like is formed, a contact hole 111 is formed, and an upper interconnect layer 112 of Al or the like is formed. Thereby, a magnetoresistive element having the structure illustrated in FIG. 4 is finished.

A distribution of concentration of atoms forming a reactant in the magnetoresistive element formed in the present embodiment is substantially the same as the case of adopting gas-phase treatment illustrated in FIG. 6. Directly after the gas treatment, the concentration is maximum at the uppermost surface of the second ferromagnetic layer 106, and gradually decreases as the distance from the surface increases, as indicated by broken line 301. On the other hand, after formation of the upper layer 107 and finish of the device manufacturing process, the atoms forming the treatment gas are diffused above the upper layer 107, and has a distribution in which the concentration is high in the central part and low in the lower surface and the upper surface, as indicated by solid line 302.

In the magnetoresistive element formed in the present embodiment, the atoms forming the reactant remain in the second ferromagnetic layer 106 by about 1% or more. These atoms remain between the atoms of the second ferromagnetic layer, and are considered as increasing the atomic distance between the atoms that express ferromagnetism. Since the volume as the magnetic layer increases with the magnetic properties maintained, there is the effect of improving the thermal stability Δ (=E/kbT) and suppressing abnormal magnetization reversal.

As described above, according to the present embodiment, the CoFeB layer 105 serving as a ferromagnetic layer of the magnetoresistive element is formed, and then treated in a liquid-phase atmosphere that reacts with B, and thereby the CoFeB layer 106 with a reduced B concentration lower than that of the CoFeB layer 105 is formed. This structure promotes (001) orientation of CoFeB—MgO—CoFeB after annealing, achieves high MR ratio, and produces a similar effect as that of the present embodiment.

Modification

The present invention is not limited to the above embodiments.

The treatment atmosphere for the ferromagnetic layer in the first embodiment is not limited to a gas-phase atmosphere including $H_2$ gas molecules, but may be a gas-phase atmosphere containing gas molecules of any of F, Cl, Br, and I atoms. In addition, the treatment atmosphere may be any gas-phase atmosphere containing gas molecules with a double bond of any of C=C, C=O, and C=N, or gas molecules with a triple bond of any of C≡C and C≡N.

The treatment atmosphere for the ferromagnetic layer in the second embodiment is not limited to a liquid-phase atmosphere including $CHCl_3$ solution, but may be a liquid-phase atmosphere containing molecules of any of F, Cl, Br, and I atoms, or a liquid-phase atmosphere containing a solute of these molecules. In addition, the treatment atmosphere may be any liquid-phase atmosphere containing molecules with a multiple bond of any of C=C, C=O, C=N, C≡C, and C≡N, or liquid-phase atmosphere containing a solute of these molecules with any of the multiple bonds.

The distribution of the concentration of the treatment gas forming atoms or the treatment liquid forming atoms included in the second ferromagnetic layer is not limited to the distribution in which the concentration is about 1% or more in the central part and less than 1% in the surface parts. It suffices that the concentration does not greatly exceed the value.

In addition, the ferromagnetic layer is not limited to CoFeB, but may be a ferromagnetic substance containing B. The tunnel barrier layer is not limited to MgO, but may be AlN, AlON, or $Al_2O_3$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element, comprising:
   a first ferromagnetic layer formed on a base substrate;
   a tunnel barrier layer formed on the first ferromagnetic layer; and
   a second ferromagnetic layer formed on the tunnel barrier layer and containing B, the second ferromagnetic layer including at least one of H, F, Cl, Br, I, C, O, and N,
   wherein a concentration of molecules of said at least one of H, F, Cl, Br, I, C, O, and N included in the second ferromagnetic layer is higher in a central portion in a depth direction of the second ferromagnetic layer than in an upper surface and a lower surface thereof.

2. The magnetoresistive element of claim 1, wherein one of the first and second ferromagnetic layers is a magnetization fixed layer, the other of the first and second ferromagnetic layers is a magnetization free layer, and the magnetoresistive element is used as a memory cell of a magnetoresistive random access memory.

3. The magnetoresistive element of claim 1, wherein the second ferromagnetic layer includes Co and Fe.

4. The magnetoresistive element of claim 1, wherein the concentration of molecules of said at least one of H, F, Cl, Br, I, C, O, and N included in the second ferromagnetic layer is 1% or higher in the central portion in the depth direction of the second ferromagnetic layer, whereas the concentration is less than 1% in the upper surface and the lower surface thereof.

* * * * *